US008963201B2

(12) United States Patent
Shrivastava et al.

(10) Patent No.: US 8,963,201 B2
(45) Date of Patent: Feb. 24, 2015

(54) TUNABLE FIN-SCR FOR ROBUST ESD PROTECTION

(75) Inventors: Mayank Shrivastava, Unterhaching (DE); Christian Russ, Diedorf (DE); Harald Gossner, Riemerling (DE)

(73) Assignee: Intel Mobile Communications GmbH, Neubiberg (DE)

(*) Notice: Subject to any disclaimer, the term of this patent is extended or adjusted under 35 U.S.C. 154(b) by 186 days.

(21) Appl. No.: 13/411,667

(22) Filed: Mar. 5, 2012

(65) Prior Publication Data

US 2013/0229223 A1 Sep. 5, 2013

(51) Int. Cl.
*H01L 29/66* (2006.01)

(52) U.S. Cl.
USPC .......... 257/167; 257/175; 257/E29.225; 438/133

(58) Field of Classification Search
CPC ........ H01L 29/7436; H01L 29/66393; H01L 27/1027; H01L 29/87
USPC ........... 257/167, 175, E29.225; 438/133
See application file for complete search history.

(56) References Cited

U.S. PATENT DOCUMENTS

| | | | |
|---|---|---|---|
| 6,909,149 B2 | 6/2005 | Russ et al. | |
| 7,135,745 B1 * | 11/2006 | Horch et al. | 257/368 |
| 7,285,804 B2 * | 10/2007 | Quek et al. | 257/133 |
| 7,638,370 B2 | 12/2009 | Gossner et al. | |
| 7,683,417 B2 | 3/2010 | Xiong et al. | |
| 2004/0207021 A1 | 10/2004 | Russ et al. | |
| 2005/0212051 A1 | 9/2005 | Jozwiak et al. | |
| 2007/0012945 A1 * | 1/2007 | Sugizaki | 257/124 |
| 2007/0262386 A1 * | 11/2007 | Gossner et al. | 257/355 |
| 2009/0206367 A1 | 8/2009 | Gauthier, Jr. et al. | |
| 2010/0207161 A1 * | 8/2010 | Shrivastava et al. | 257/133 |
| 2012/0049279 A1 | 3/2012 | Shrivastava et al. | |

OTHER PUBLICATIONS

International Search Report dated Jul. 5, 2013 for International Application No. PCT/EP2013/054390. 6 Pages.
Preliminary Report on Patentability dated Sep. 9, 2014 for International Application No. PCT/EP2013/054390.

* cited by examiner

*Primary Examiner* — Steven J Fulk
(74) *Attorney, Agent, or Firm* — Eschweiler & Associates, LLC

(57) ABSTRACT

One embodiment of the present invention relates to a silicon-controlled-rectifier (SCR). The SCR includes a longitudinal silicon fin extending between an anode and a cathode and including a junction region there between. One or more first transverse fins traverses the longitudinal fin at one or more respective tapping points positioned between the anode and the junction region. Other devices and methods are also disclosed.

25 Claims, 14 Drawing Sheets

200

200

300B

TUNABLE FIN-SCR FOR ROBUST ESD PROTECTION

BACKGROUND

An electrostatic discharge (ESD) pulse is a sudden and unexpected voltage and/or current discharge that transfers energy to an electronic device from an outside body, such as from a human body for example. ESD pulses can damage electronic devices, for example by "blowing out" a gate oxide of a transistor in cases of high voltage or by "melting" an active region area of a device in cases of high current, causing junction failure.

To protect electronic devices from ESD pulses, engineers have developed ESD protection devices. FIG. 1 shows an example of an integrated circuit 100 that includes an ESD-susceptible circuit 102 that can be electrically connected to an exterior circuit assembly (not shown) via external IC pins 104A, 104B. A conventional ESD protection device 106 is electrically connected between circuit 102 and external pins 104A, 104B to mitigate damage due to an ESD pulse 108, if present. If an ESD pulse 108 occurs, a trigger element 110 detects ESD pulse 108 and provides a trigger signal 112 to a silicon controlled rectifier (SCR) 114. In response to this trigger signal 112, SCR 114 quickly shunts energy of ESD pulse 108 away from circuit 102 (e.g., as shown by arrow $W_{ESD}$), thereby preventing damage to circuit 102.

FIG. 2A shows one depiction of an SCR device 200, which is often implemented as a pair of tightly coupled bipolar junction transistors (BJTs) 202A, 202B, such as shown in FIG. 2B. In such an SCR device 200, when the gate-to-cathode voltage exceeds a certain threshold, SCR 200 turns "on". Thus, when ESD event 108 is impingement and trigger element 110 asserts its trigger signal 112 in FIG. 1, SCR 114 turns "on" and diverts power of ESD pulse 108 away from circuit 102. SCR 114 will remain "on" even after gate current is removed so long as current/voltage through SCR 114 remains above a holding current/voltage. Once current/voltage falls below the holding current/voltage for an appropriate period of time (e.g., once ESD event 108 has passed), SCR 114 will switch "off" and normal blocking operation will resume.

Although this methodology is generally effective in the ESD context, until now it has been burdensome to set accurate trigger and holding voltages/currents for traditional SCR devices across technologies. For example, one manufacturing flow may be designed for circuit 102 to be powered by a 5 V supply from external IC pin, while another manufacturing flow may be designed for circuit 102 (or some variation thereof) to be powered by a 1.2V supply. If rigorous design and testing is not carried out, SCR 114 could inadvertently be triggered (e.g., if trigger voltage is set too low) or could divert power for too long (e.g., if holding current is set too low); leading to problems in operation. As will be appreciated in greater detail below, the present disclosure relates to improved SCR devices which allow independent and robust running of trigger and holding voltages by using simple layout parameters. These tunable Fin-SCRs are beneficial in ESD protection devices, such as shown in FIG. 1 for example, as well as other circuits.

DETAILED DESCRIPTION

Figure 1:
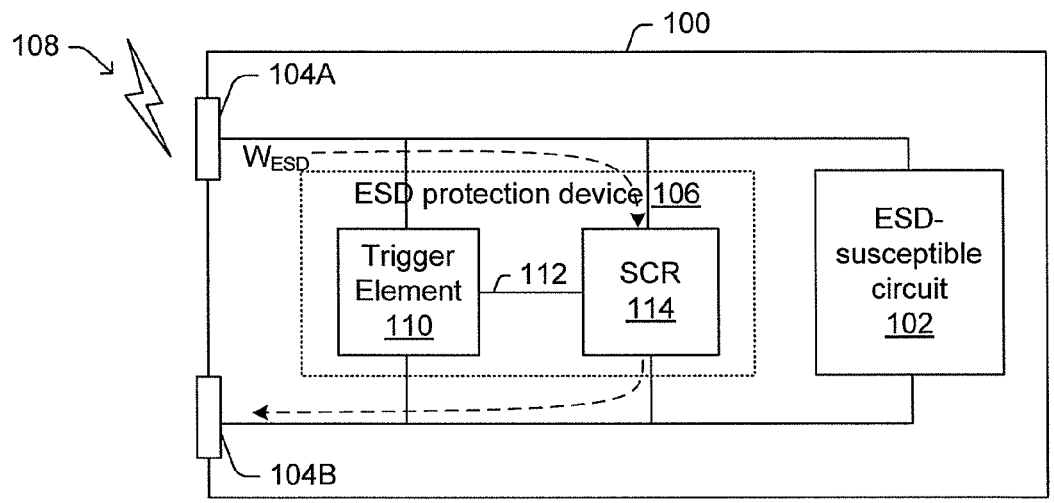
FIG. 1 shows an integrated circuit that includes a conventional ESD protection circuit.
Figure 2A:
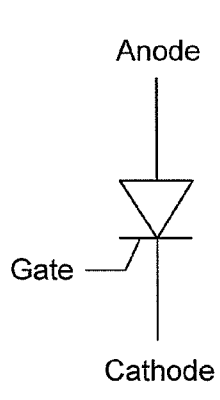
FIG. 2A shows a symbolic representation of a conventional silicon controlled rectifier (SCR).
Figure 2B:
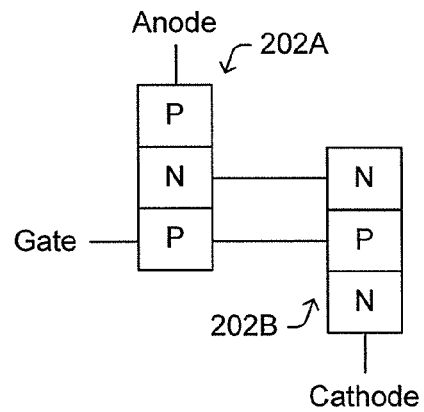
FIG. 2B shows a schematic representation of a conventional SCR.

The present invention will now be described with reference to the attached drawing figures, wherein like reference numerals are used to refer to like elements throughout, and wherein the illustrated structures and devices are not necessarily drawn to scale. Further, to the extent that some illustrated embodiments may be described with reference to a Fin field effect transistor (FinFET), it will be appreciated that the term FinFET includes, but is not limited to: tri-gate transistors, omega transistors, multi-gate transistors (MUGFETs) and the like, all of which are contemplated as falling within the scope of the present invention.

Referring now to FIGS. 3A-3D, one can see one example of a SCR device 300 in accordance with some embodiments of the present disclosure. SCR device 300, which can be formed on a bulk silicon or silicon on insulator (SOI) substrate 302, includes a longitudinal silicon fin 304 extending between an anode 306 and a cathode 308 in a first direction. A junction region 310 is arranged on the longitudinal fin 304 between anode and cathode. A plurality of transverse fins can branch off from the longitudinal fin in a second direction. These transverse fins can include one or more anode-side fins 312 (which can also be referred to as a "first transverse fin" in some embodiments) and one ore more cathode-side fins 316 (which can also be referred to as a "second transverse fin" in some embodiments). When the SCR device 200 is used in an ESD protection circuit, distal ends of the anode-side fins 312 and/or cathode-side fins 316 can be coupled to an anode-side electric field control tap and cathode-side electric field control tap, respectively, which can be coupled to a voltage bias circuit, such as a trigger element (e.g., trigger element 110 of FIG. 1) for example. The anode-side and cathode side electric field control taps can have different voltage biases or the same voltage bias applied, depending on the implementation. As will be appreciated in more detail herein, the number of transverse fins and their respective geometries draws current from the longitudinal fin 304 to influence the trigger voltage and holding voltage of the SCR 300.

More particularly, 3B shows a top view of SCR 300. As shown, longitudinal fin 304 includes first and second inner regions 318, 322, respectively, which are collectively arranged between the first and second distal regions 316, 324. First distal region 316, which can act as an anode, has a first conductivity type (e.g., p-type) at a first doping concentration (e.g., P+), which can range from 5e19 cm$^{-3}$ to 5e21 cm$^{-3}$ in some embodiments. The first distal region 316 can contact first inner region 318 at junction 320. First inner region 318 has a second conductivity type (e.g., n-type) at a second doping concentration (e.g., N), which can range from 1e14 cm$^{-3}$ to 5e18 cm$^{-3}$. First inner region 318 can contact second inner region 322 at junction 310. Second inner region 322 has the first conductivity type (e.g., p-type) at a third doping concentration (e.g., P), which can range from _1e14 cm$^{-3}$ to 5e18 cm$^{3}$ in some embodiments. Second distal region 324, which can act as a cathode, contacts the second inner region 322 at junction 326. The second distal region 324 has the second conductivity type (e.g., n-type) at a fourth doping concentration (e.g., N+), which can range from approximately 5e19 cm$^{-3}$ to approximately 5e21 cm$^{3}$ in some embodiments.

One or more anode-side fins 312 (e.g., 312a, 312b, 312c) traverse the longitudinal fin 304 at respective tapping points (e.g., 314a, 314b, 314c, respectively) arranged between anode 306 and junction region 310. The anode-side fins 312 are used as sinker elements which help to control the holding voltage during SCR action. The most distal anode-side fin 312a is spaced apart from junction 320 by distance $AF_{SP}$, while the innermost anode-side fin 312c is spaced apart from junction 310 by distance $JF_{SP}$. Neighboring anode-side fins are separated by distance $FF_{SP}$, which can vary between different neighboring anode-side fins in some embodiments. In embodiments where the anode-side fins 312 are made of silicon, inner regions 326 of the anode-side fins can have the second conductivity type (e.g., n-type) at the second doping concentration (N), which can range from approximately 1e14 cm$^{-3}$ to approximately 5e18 cm$^{-3}$ in some embodiments. Middle regions 328 of the anode-side fins 312 can have the first conductivity type (e.g., p-type) at the third doping concentration (P), which can range from approximately 1e14 cm$^{-3}$ to approximately 5e18 cm$^{-3}$ in some embodiments. Distal regions 330 of the anode-side fins 312 can have the first conductivity type (e.g., p-type) at the first doping concentration (P+), which can range from approximately 5e19 cm$^{-3}$ to approximately 5e21 cm$^{-3}$ in some embodiments.

Cathode-side fins 316 (e.g., 316a, 316b, 316c) can traverse the longitudinal fin 304 at respective tapping points (e.g., 314d, 314e, 314f, respectively) between junction region 310 and cathode 308. Cathode-side fins 316 can branch off the longitudinal fin 304 at the second inner region 322. If present, the cathode-side fins 316 can include inner regions 332 (P) and distal regions 334 (P+), wherein the inner regions 332 have a length $L_{PP}$ as measured from a sidewall of longitudinal fin 304. The inner regions 322 can have a doping concentration ranging from approximately 1e14 cm$^{-3}$ to approximately 5e18 cm$^{-3}$, while the distal regions can have doping concentrations that range from approximately 5e19 cm$^{-3}$ to approximately 5e21 cm$^{-3}$ in some embodiments.

One advantage of the layout of SCR 300 is that it allows a designer to efficiently tune the SCR characteristics by changing the arrangement and geometries of the fins. Table 1 below shows how the layout parameters can be changed to tune the characteristics of SCR device 300 in accordance with aspects of this disclosure.

TABLE 1

| Parameter (↑) | $R_{ON}$ | $V_{HOLD}$ | $V_{TI}$ |
|---|---|---|---|
| $AF_{SP}$ | • | ↑ | ↑ |
| $FF_{SP}$ | • | ↑ | ↑ |
| $L_N$ | • | ↑ | ↑ |
| $N_{EXT}$ Doping (e.g., 318 and 326 in FIG. 3) | ↓ | ↓ | ↓ |
| $P_{EXT}$ doping (e.g., 322 and 332 in FIG. 3) | • | ↓ | ↓ |
| # of anode-side fins | ↑ | ↑ | ↑ |
| # of cathode-side fins | ↑ | ↓ | • |
| $L_P$ | • | ↑ | ↑ |
| $JF_{SP}$ | • | ↑ | ↑ |
| $L_{PP}$ | ↑ | ↑ | • |

Thus, for example, as the length $AF_{SP}$ is increased, the on-resistance ($R_{ON}$) of the SCR device stays essentially constant, while the holding voltage ($V_{HOLD}$) and trigger voltage ($V_{TI}$) both increase. Similarly, as length $FF_{SP}$ is increased, the on-resistance ($R_{ON}$) of the SCR device stays essentially constant, while the holding voltage ($V_{HOLD}$) and trigger voltage ($V_{TI}$) both increase. In this way, the SCR fin devices disclosed herein provide designers with a flexible layout that allows for easy tuning of SCR characteristics.

Figure 3A:
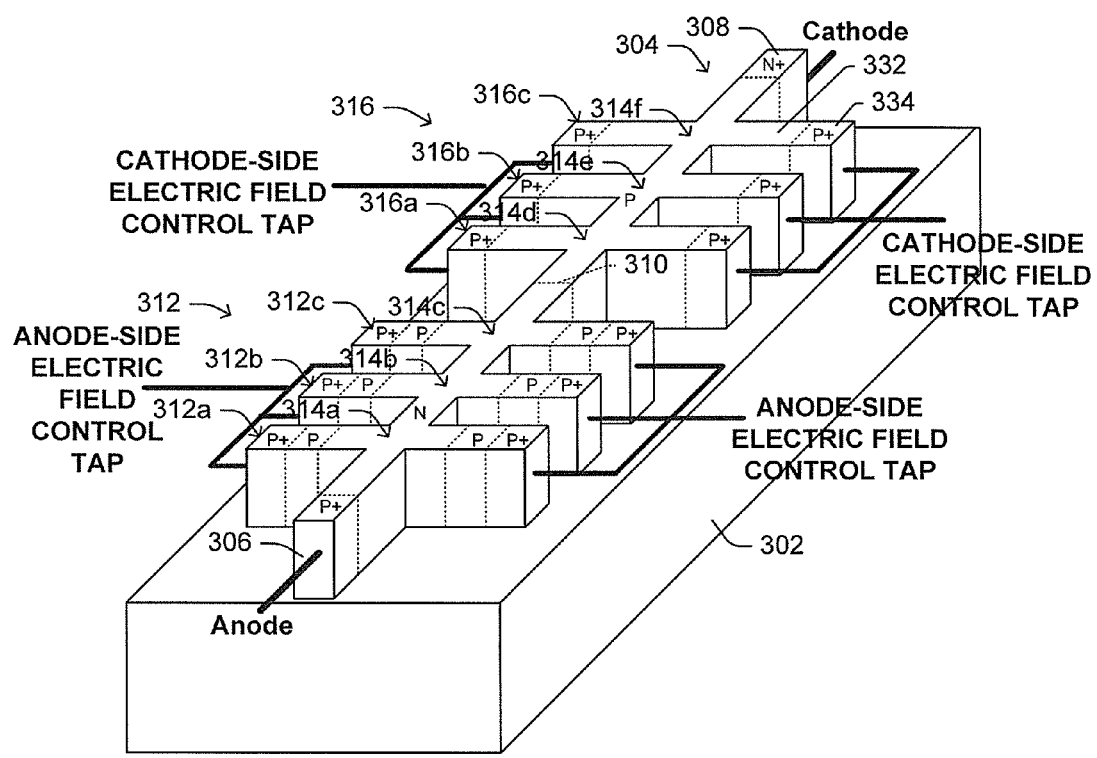
FIG. 3A shows a perspective view of an SCR in accordance with some embodiments.

It will be appreciated that complementary versions of SCR 300 of FIG. 3A-3D, as well as complementary versions of other illustrated embodiments are also contemplated as falling within the scope of the present disclosure. In such complementary versions, the n-regions and p-regions, which can be said to have an "n-conductivity" and "p-conductivity", respectively, are "flipped". Thus, FIG. 4 for example, shows an SCR device 400 that is complementary relative to the embodiment of FIG. 3A-3D. In this regard, it will be appreciated that the terms "first conductivity type" and "second conductivity type" are not limited to n-type conductivity and p-type conductivity, but rather are just generic identifiers that can encompass multiple conductivity and doping arrangements.

Figure 5A:
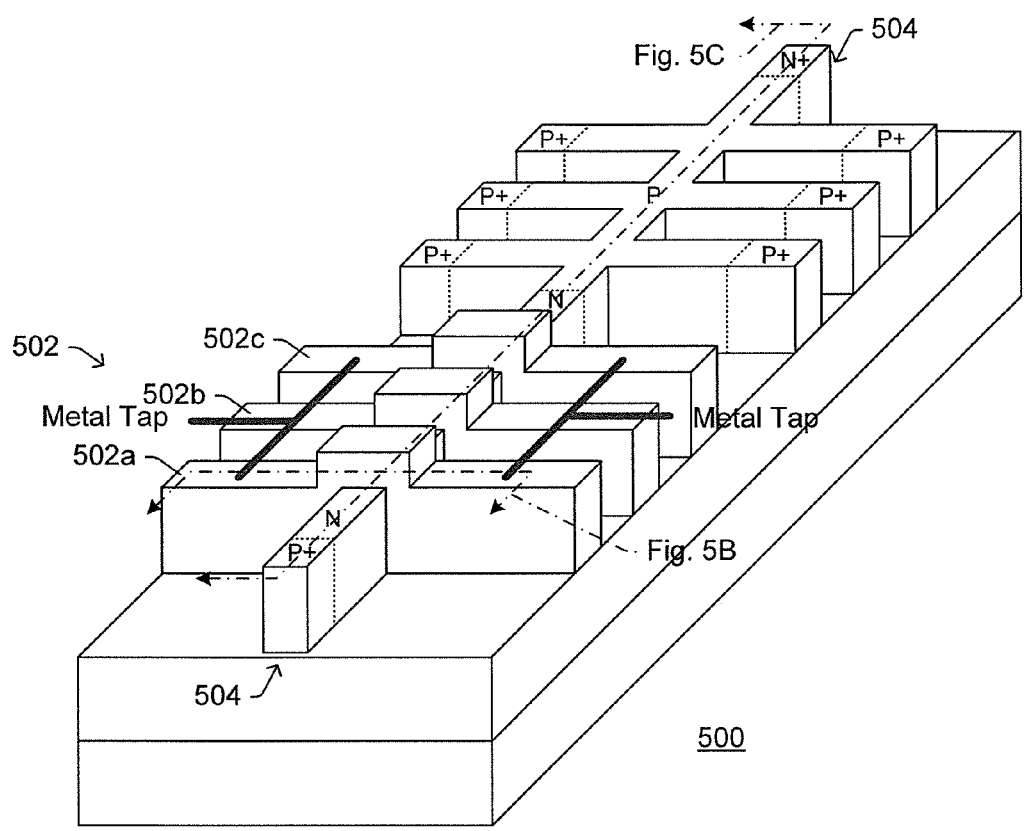
FIG. 5A shows a perspective view of an SCR having metal taps in accordance with some embodiments.
Figure 5B:
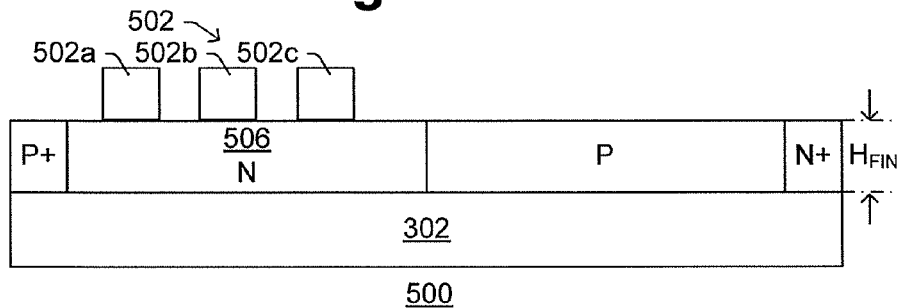
FIG. 5B shows a cross-sectional view of FIG. 5A's SCR, as viewed along the longitudinal fin in accordance with some embodiments.
Figure 5C:
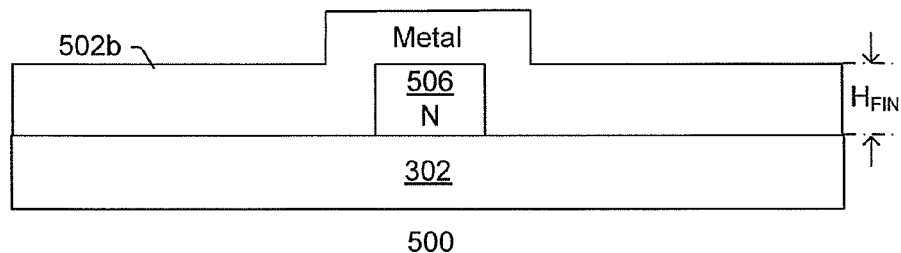
FIG. 5C shows a cross-sectional view of FIG. 5A's SCR, as viewed along a transverse fin in accordance with some embodiments.

FIGS. 5A-5C show another embodiment of an SCR device 500 in accordance with some embodiments. In this embodiment, one or more metal fins 502 (e.g., 502a, 502b, 502c) replace one or more silicon anode or cathode-side fins from the embodiment of FIGS. 3A-3D. These metal fins 502 straddle the longitudinal fin 304 at respective tapping points, and are in direct electrical contact with the longitudinal fin 504. Thus, there is typically no dielectric layer between the metal fins 502 and the longitudinal fin 504. A voltage bias circuit is typically coupled to the metal fins 502, such that the metal fins 502 can deplete the first inner region 506 of the longitudinal fin 504, for example, to tune the trigger voltage of the SCR 500.

Figure 6:
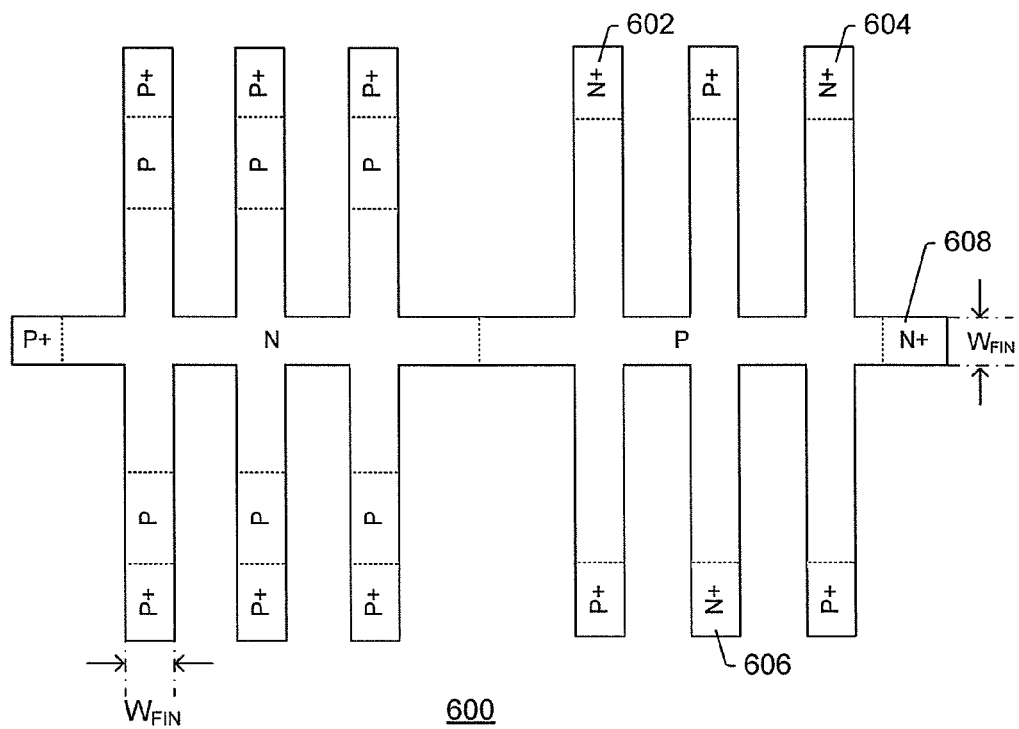
FIGS. 6-7 show examples of alternative cathode arrangements in accordance with some embodiments.

FIG. 6 shows another embodiment of an SCR 600 with a different cathode combination. In this SCR 600, some of the distal ends 602, 604, 606 of cathode-side fins are doped N+ (rather than P+ as shown in FIGS. 3A-3D). Thus, these distal ends 602, 604, 606 can also act as cathode terminals, and can be coupled to the cathode 608. This cathode combination will improve the bipolar efficiency of SCR's NPN BJT on the cathode side by increasing the emitter injection, which will reduce the holding voltage ($V_{HOLD}$) and $R_{ON}$ of the SCR 600, relative to the embodiment of FIG. 3A-3D.

Figure 7:
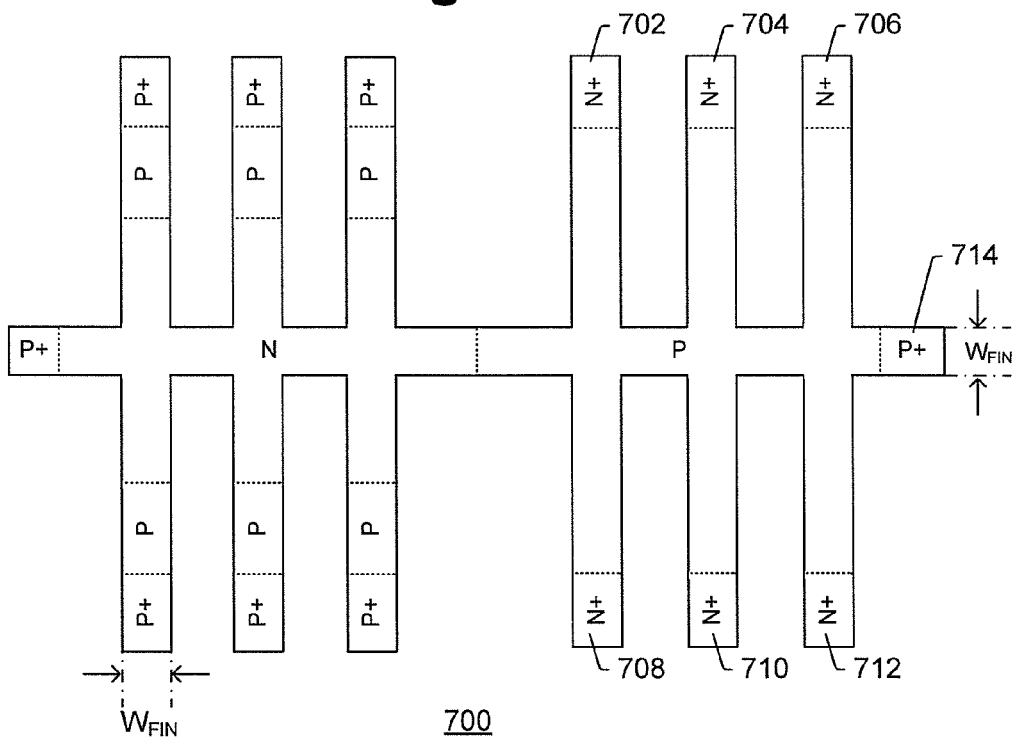

FIG. 7 shows another embodiment of an SCR 700 with another cathode combination. In this SCR 700, all of the distal ends 702-712 of the cathode-side fins are doped N+ (rather than P+ as shown in FIGS. 3A-3D), thereby acting as cathode terminals. Note that the distal end of longitudinal fin 714 can now be doped P+ such that it no longer acts as a cathode. The distal end 714 now acts more akin to a cathode-side fin from previous embodiments, in that it can draw current from longitudinal fin and/or be used to adjust the trigger voltage of SCR. This embodiment will reduce the holding voltage ($V_{HOLD}$) by increasing emitter injection from the NPN transistor on the cathode side. Other combinations of doping in distal ends of cathode also fall within the scope of this disclosure.

Figure 3B:
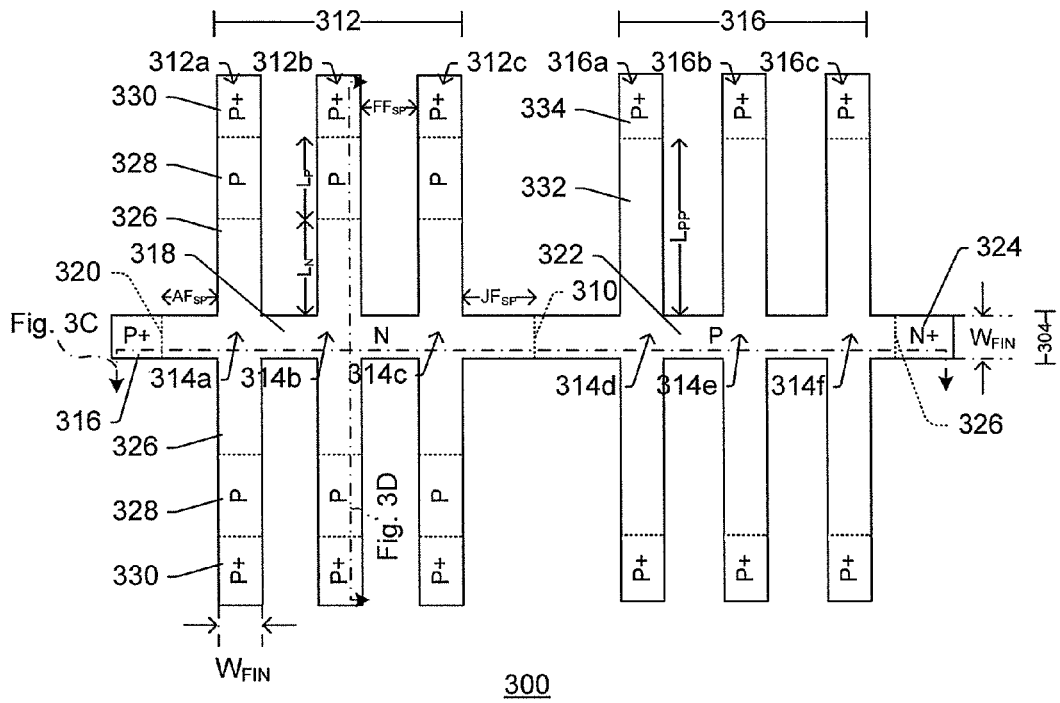
FIG. 3B shows a top view of FIG. 3A's SCR.
Figure 3C:
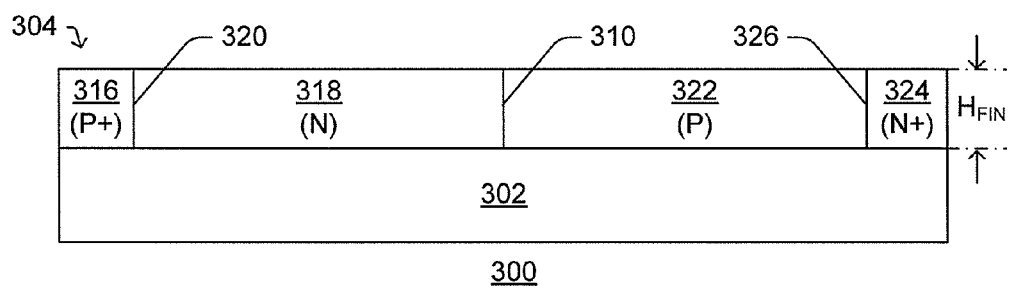
FIG. 3C shows a cross-sectional view of FIG. 3A's SCR, as viewed along the longitudinal fin.
Figure 3D:
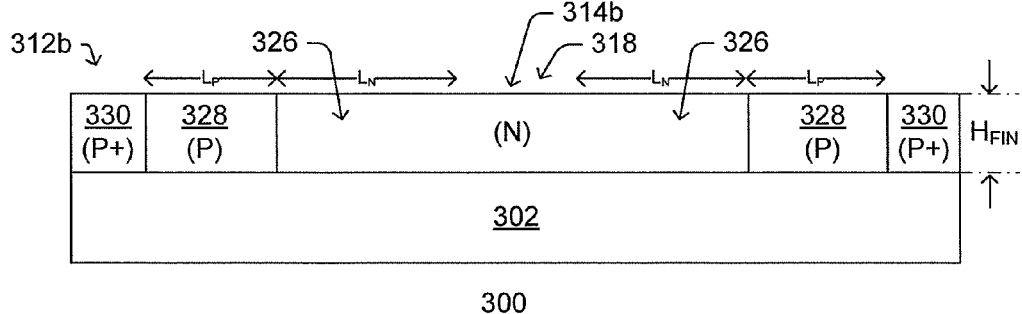
FIG. 3D shows a cross-sectional view of FIG. 3A's SCR, as viewed along a transverse fin.
Figure 4:
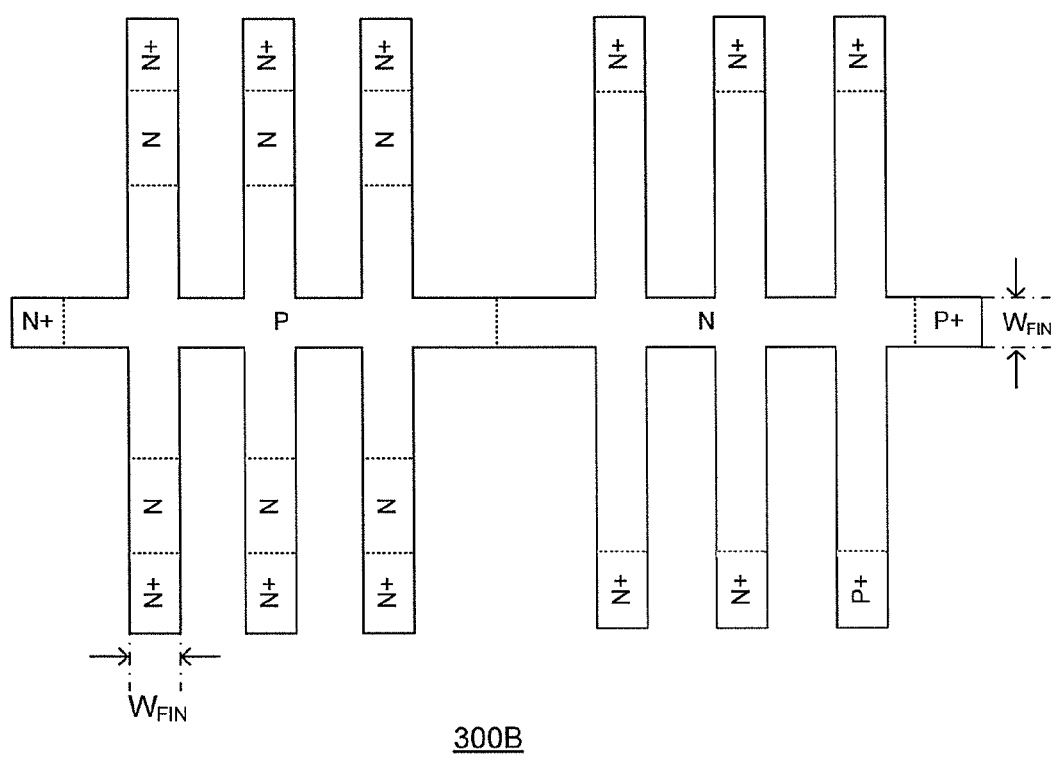
FIG. 4 shows a top view of an SCR in accordance with some embodiments, wherein the doping types establish a complementary SCR relative to the embodiment of FIGS. 3A-3D.
Figure 8:
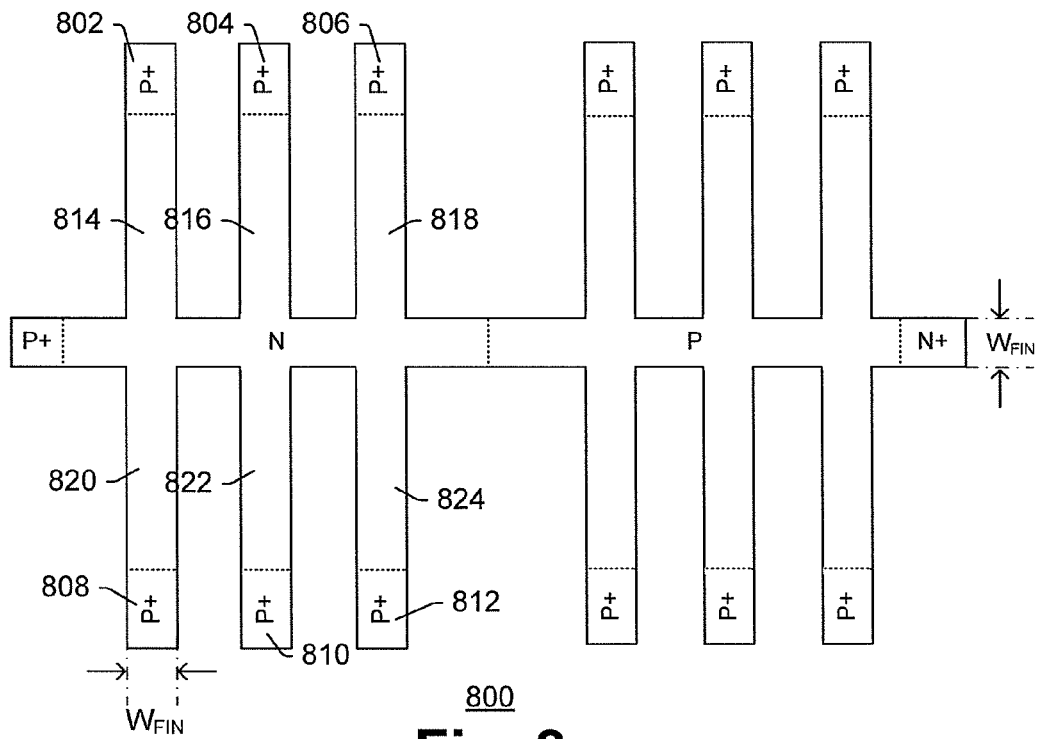
FIG. 8 shows an example of an alternate doping configuration for anode-side fins in accordance with some embodiments.

FIG. 8 shows another embodiment of an SCR 800 where the P+ regions 802-812 on the anode-side fins are directly next to first inner regions 814-824 of anode-side fin with no p-region there between (e.g., Lp from FIG. 3B is zero). This will reduce the trigger voltage of SCR 800, relative to the embodiment illustrated in FIGS. 3A-3D.

Figure 9:
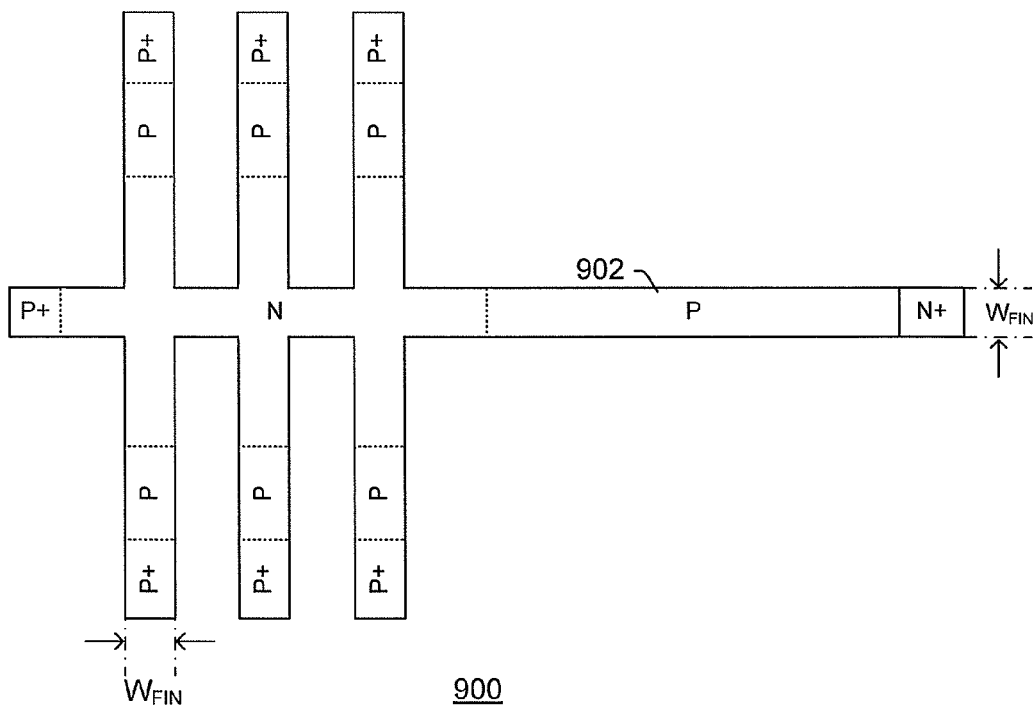
FIG. 9 shows an example where cathode-side fins have been removed.

FIG. 9 shows another SCR 900 where cathode-side fins have been removed. This embodiment will cause excess carrier accumulation in the second inner region 902 of longitudinal fin and will reduce the holding voltage, relative to the embodiment illustrated in FIGS. 3A-3D.

Figure 10:
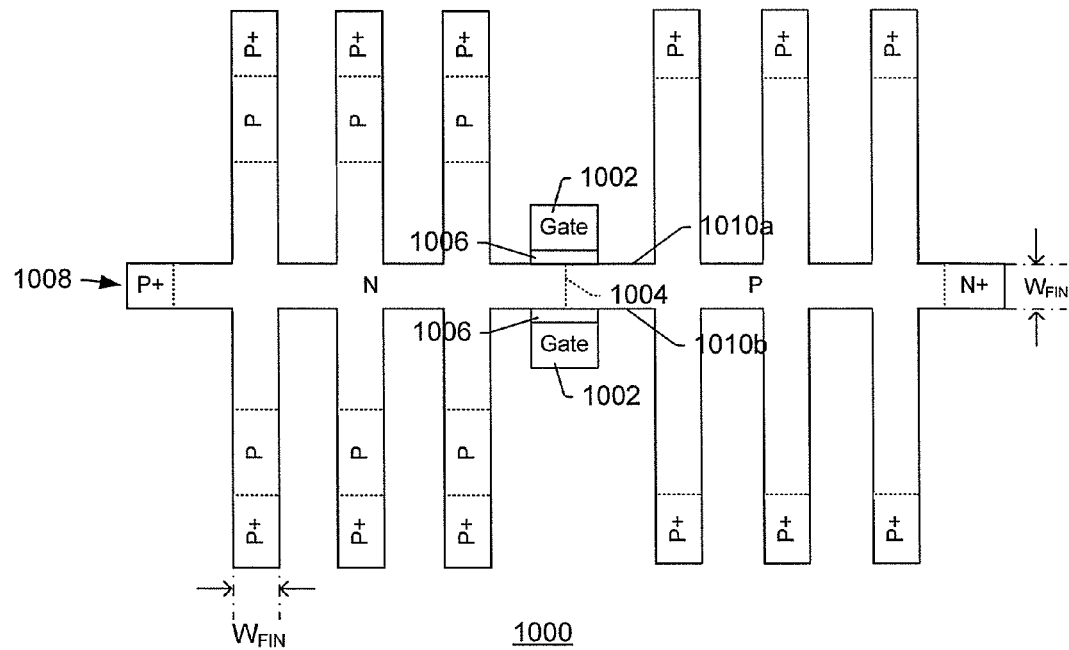
FIGS. 10-11 show examples of SCR devices that include a gate electrode in accordance with some embodiments.

FIG. 10 shows another embodiment of an SCR 1000 that includes an electrically conductive gate 1002 arranged near junction region 1004. A gate dielectric 1006 electrically isolates the gate 1002 from silicon longitudinal fin 1008. A voltage bias circuit (not shown) can apply a voltage to the conductive gate 1002 to deplete carriers from the junction region 1004, thereby controlling (e.g., increasing) the trigger voltage. Note that the electrically conductive gate 1002 can be disposed on only sidewalls 1010a, 1010b of the longitudinal fin 1008 in some embodiments, while in other embodiments the electrically conductive gate 1002 can also extend over or straddle the longitudinal fin 1008.

Figure 11:
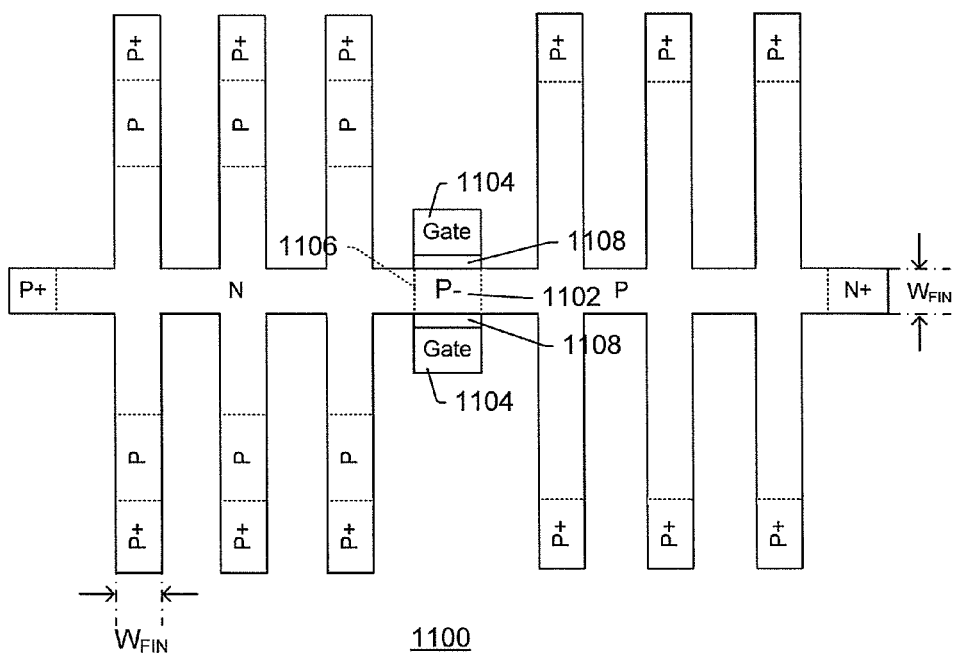

FIG. 11 shows still another SCR 1100 where a lightly doped region 1102 (e.g., p-) is formed under gate 1104, and wherein p-n junction 1106 is shifted to the left edge of the gate 1104. Gate dielectric 1108 is again present. SCR 1100 can still use the gate 1104 to reduce the trigger voltage, and SCR 1100 is more compatible with many manufacturing processes, relative to FIG. 10's embodiment.

Figure 12A:
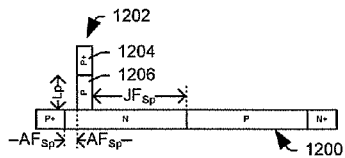
FIGS. 12A-12O show a number of variations of semiconductor devices in accordance with some aspects of this disclosure.
Figure 12E:
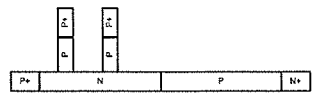
Figure 12J:
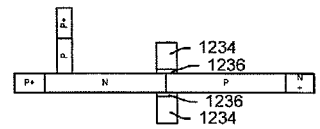
Figure 12B:
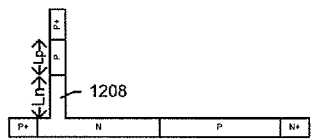
Figure 12F:
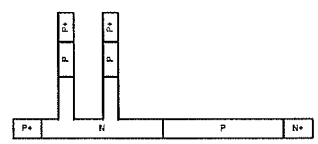
Figure 12K:
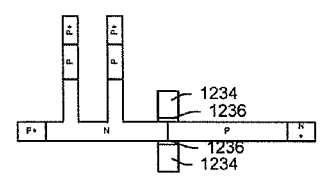
Figure 12C:
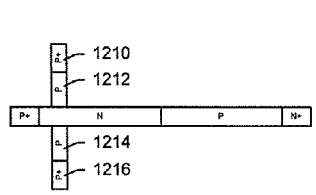
Figure 12G:
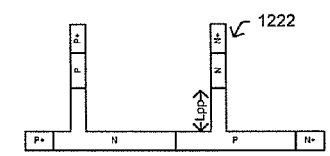
Figure 12L:
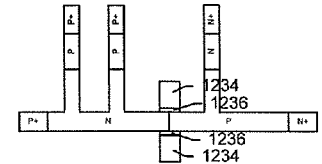
Figure 12D:
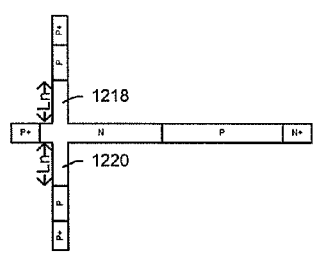
Figure 12H:
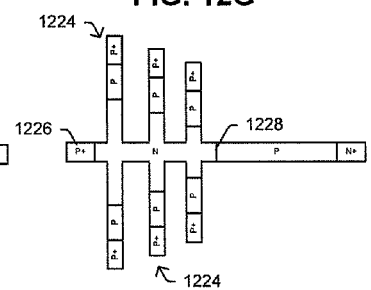
Figure 12M:
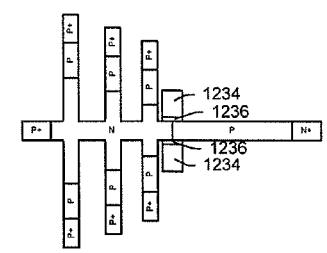
Figure 12O:
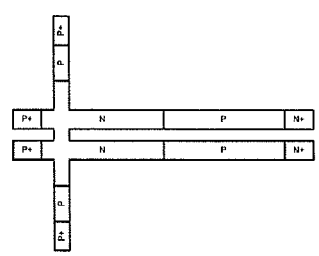

FIG. 12A-O shows a number of variations for SCR devices falling within the scope of the present disclosure. These variations are by no means limiting in any way, but rather describe merely a few examples that fall within the scope of the present disclosure. Also, although FIG. 12A-O's SCR devices are shown with silicon transverse fins, it will be appreciated that metal transverse fins can also be substituted for one or more of the silicon transverse fins in each example.

FIG. 12A shows an example with a longitudinal fin 1200 as previously described with respect to FIG. 3A, and with a single anode-side fin 1202. The single anode-side fin has a first transverse distal region 1204 (e.g., P+) and a first transverse inner region 1206 (e.g., P). The first transverse distal region 1204 and first transverse inner region 1206 both extend outwardly in a first direction from sidewall of longitudinal fin 1200.

In FIG. 12B, a second transverse inner region 1208 (e.g., N) has also been added. FIG. 12 B's anode-side fin still extends outwardly in a first direction from sidewall of longitudinal fin.

FIG. 12C shows another example, similar to FIG. 12A, except that single anode-side fin 1208 extends from opposing sidewalls of the longitudinal fin. The single anode-side fin 1208 in this example includes a first transverse distal region 1210 (e.g. P+), a first transverse inner region 1212 (e.g., P), a second transverse inner region 1214 (e.g., P) and a second transverse distal region 1216 (e.g., P+).

FIG. 12D's SCR is similar to FIG. 12C, except that additional inner regions 1218, 1220 (e.g., N) have been added.

As shown by FIG. 12E-12F, multiple anode-side fins may also be included. If present, multiple anode-side fins may extend in one direction from the longitudinal fin as shown in FIG. 12E-12F, but they may also extend in opposite directions similar to shown in FIG. 12C-12D.

Cathode-side fins may also be present, such as shown in FIG. 12G, for example. Although FIG. 12G shows an embodiment where a single, one-sided cathode-side fin 1222 is present, it will be appreciated that any number of cathode-side fins can be included, wherein individual cathode-side fins can extend in only one direction from the longitudinal fin or can extend in opposite directions from the longitudinal fin.

FIG. 12H shows another embodiment that includes multiple anode-side fins 1224 arranged in a "half bow-tie" configuration. The anode-side fins 1224 have respective fin lengths that are larger near the anode 1226 and which decrease nearer the junction region 1228. This arrangement makes use of the fact that shorter lengths $L_N$ correspond to a higher trigger voltage for the SCR device, and the fin closest to the junction 1228 effect the trigger voltage more strongly. Although FIG. 12H shows the anode-side fins 1224 extending in opposite directions from the sidewalls of longitudinal fin 1200, the individual anode-side fins can also extend in only one direction in other embodiments.

Figure 12I:
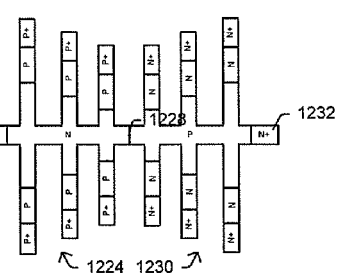
Figure 12N:
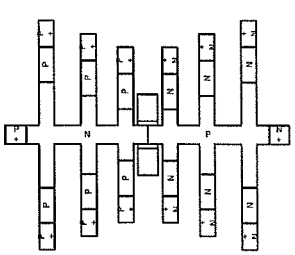

FIG. 12I illustrates another embodiment that includes multiple anode and cathode-side fins arranged in a "full bow-tie" configuration. In this embodiment, the anode-side fins 1224 have respective fin lengths that are larger near the anode 1226 and which decrease nearer the junction region 1228, and the cathode-side fins 1230 have respective fin lengths that are larger near the cathode 1232 and which decrease nearer the junction region 1228. Although FIG. 12I shows the anode and cathode-side fins extending in opposite directions from the sidewalls of longitudinal fin 1200, the individual anode and cathode-side fins can also extend in only one direction in other embodiments.

FIGS. 12J-12N show variations including a gate electrode 1234, which is electrically isolated from the longitudinal fin by a gate dielectric 1236. FIG. 12O shows another example where two longitudinal fins are in parallel and which can share electric field taps. It will be appreciated that more than two longitudinal fins in parallel could also be included in such an implementation. Although FIGS. 12A-O show a few examples, alterations and/or modifications may be made to the illustrated examples to combine these features with other features disclosed in this disclosure without departing from the spirit and scope of the appended claims.

Figure 13A:
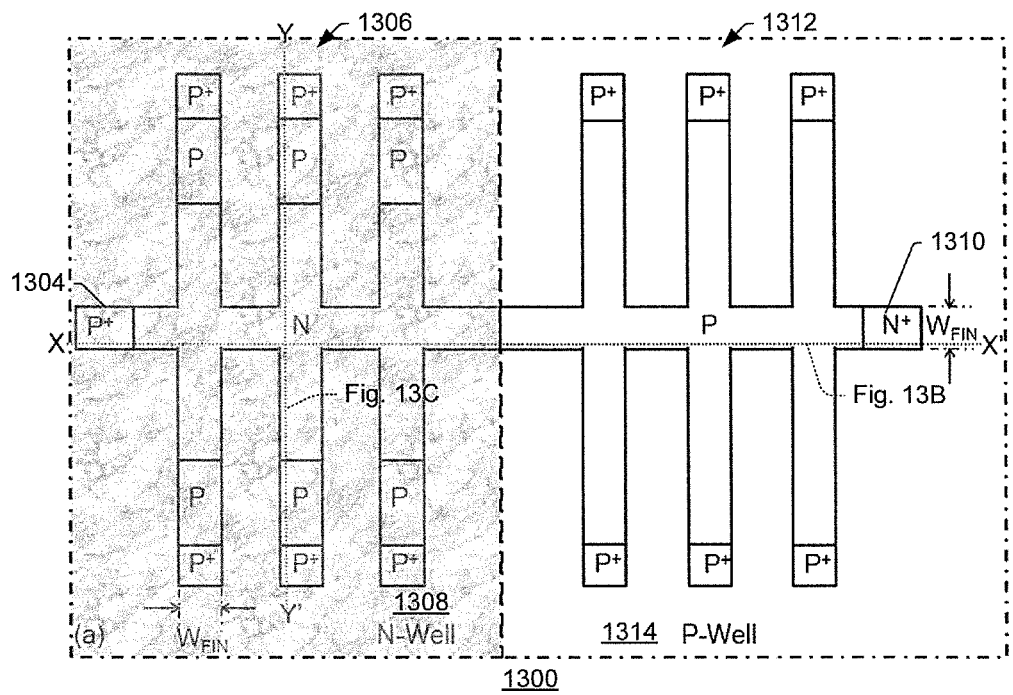
FIG. 13 shows an example of an SCR device disposed on a bulk silicon substrate.
Figure 13B:
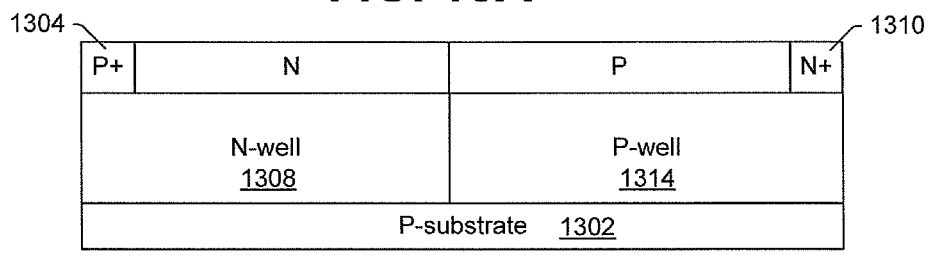
Figure 13C:
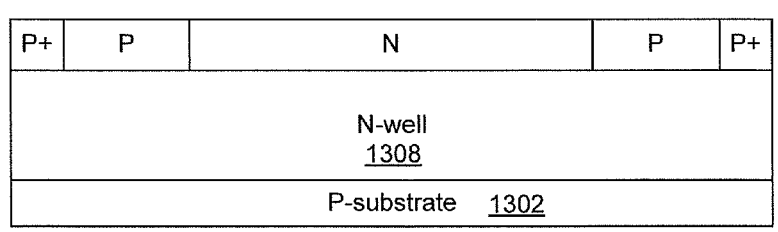

FIGS. 13A-13C shows still another variation of an SCR 1300, wherein the SCR 1300 is formed on a bulk silicon substrate 1302. In FIG. 13A-C, the anode 1304 and anode-side fins 1306 are disposed over an n-well 1308, while the cathode 1310 and cathode-side fins 1312 are disposed over a p-well 1314.

Figure 14:
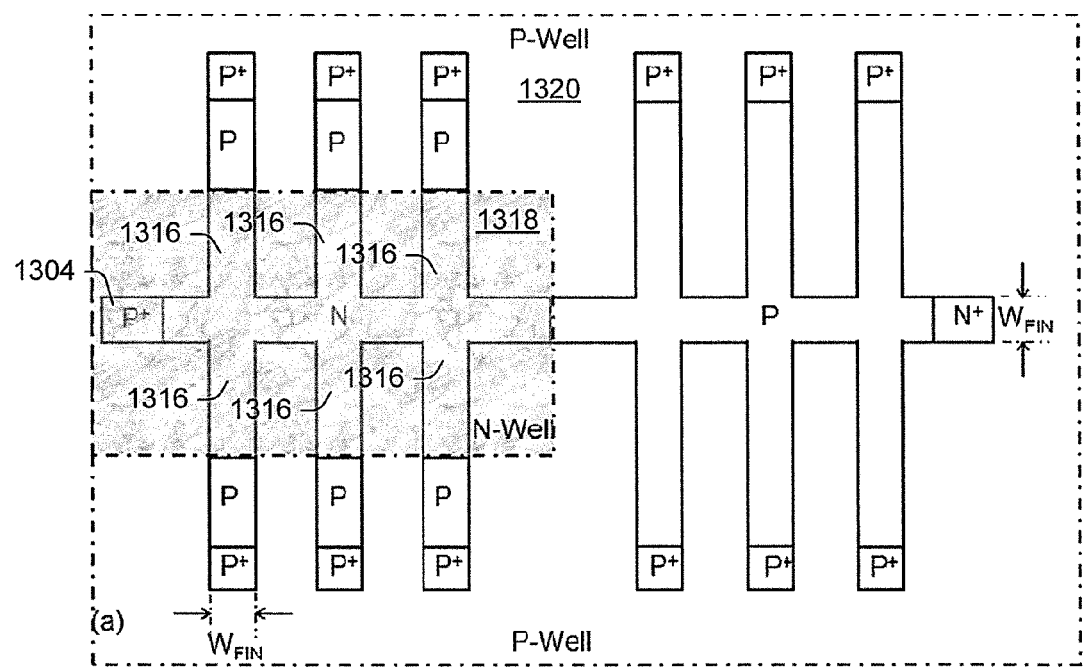
FIG. 14 shows another example of an SCR device disposed on a bulk silicon substrate.

FIG. 14 shows another embodiment where the anode 1304 and second inner regions 1316 of the anode-side fins are disposed over an n-well 1318, and the remainder of the SCR device is disposed over a p-well 1320.

Figure 15A:
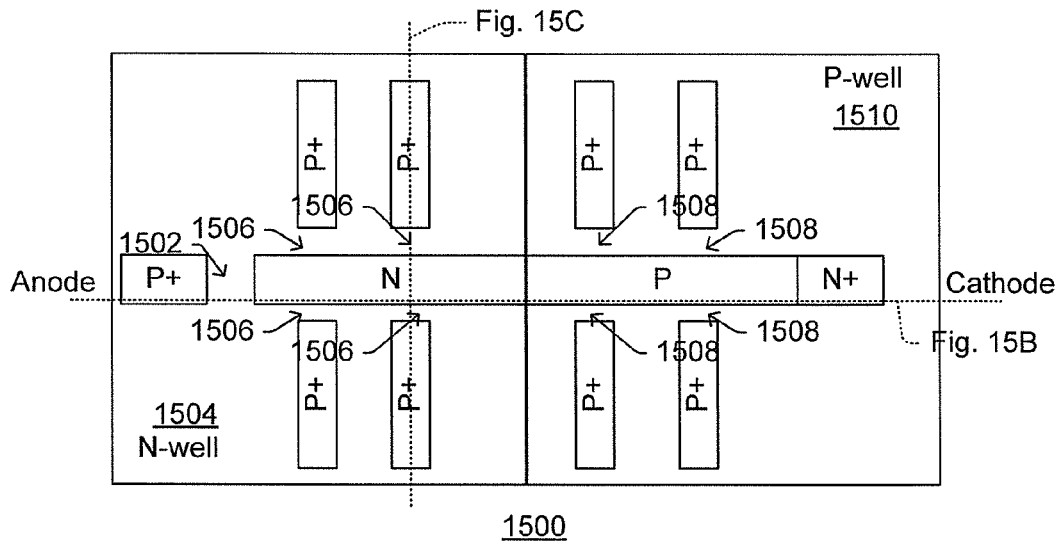
FIG. 15 shows an example of an SCR device having segmented fins.
Figure 15B:
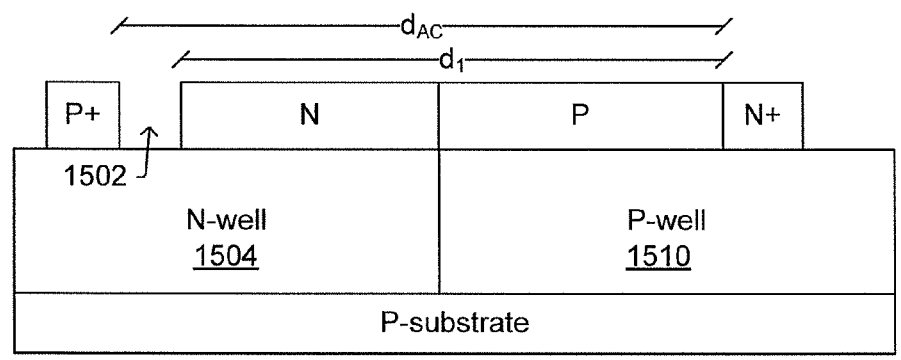
Figure 15C:
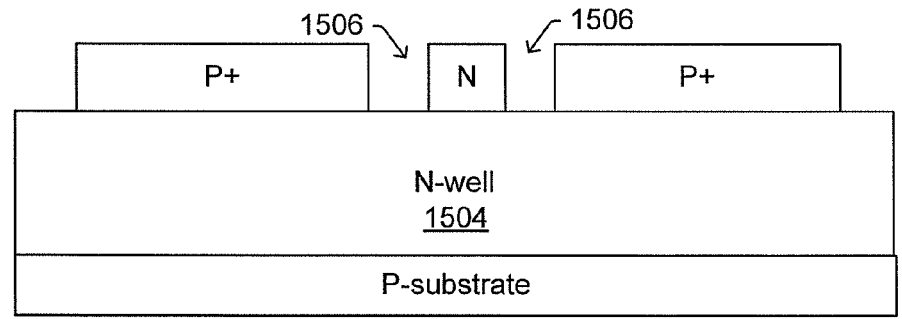

FIG. 15A-15C shows an embodiment with segmented fins. In this embodiment, the longitudinal fin has a length (e.g., $d_1$) which is less than a distance ($d_{AC}$) between the anode and cathode. Thus, the longitudinal fin includes gap 1502, which is electrically bridged by n-well 1504. The anode-side fins also include gaps 1506, which are bridged by n-well 1504; and cathode-side fins have gaps 1508 electrically bridged by p-well 1510. Note that FIGS. 15A-15C merely show one example of segmented fins. In other examples, there could also be a gap between cathode N+ and P region, and/or there could be a cap between inner N and P regions, and/or gaps in other fin locations.

Figure 16A:
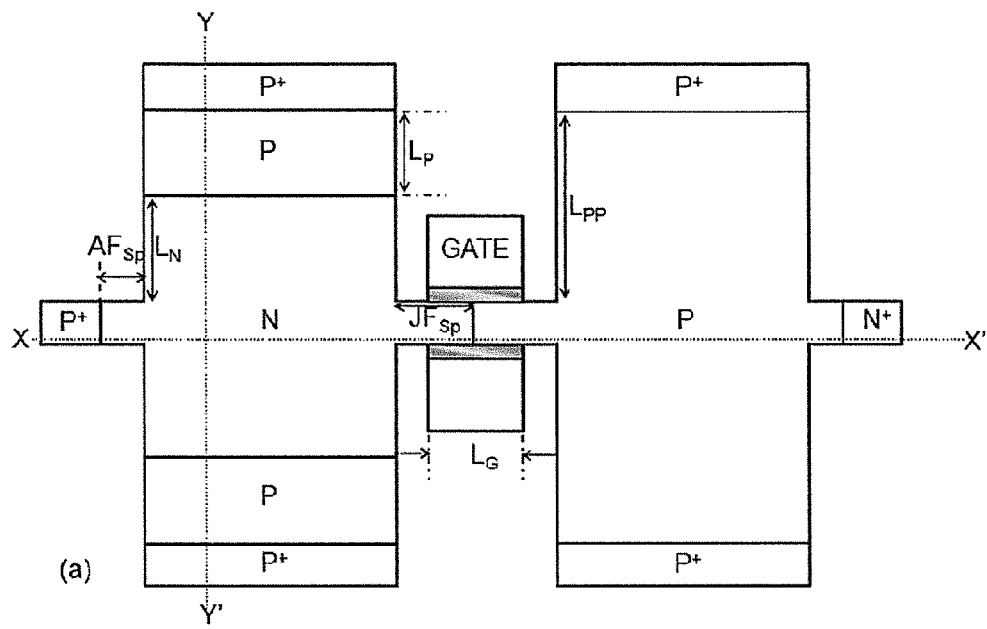
FIG. 16 shows an example of an SCR device disposed on a silicon-on-insulator (SOI) substrate.
Figure 16B:
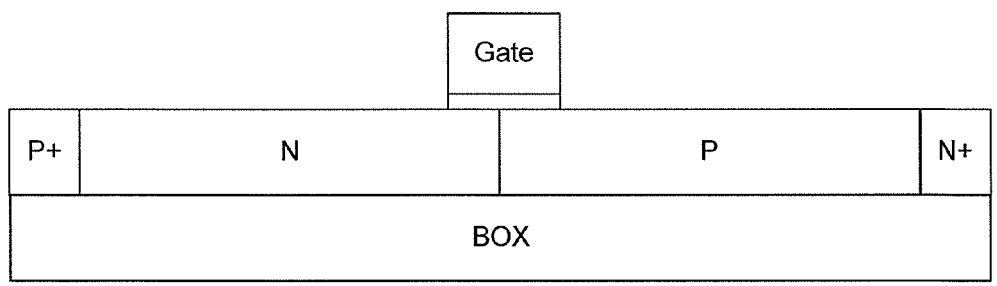
Figure 16C:
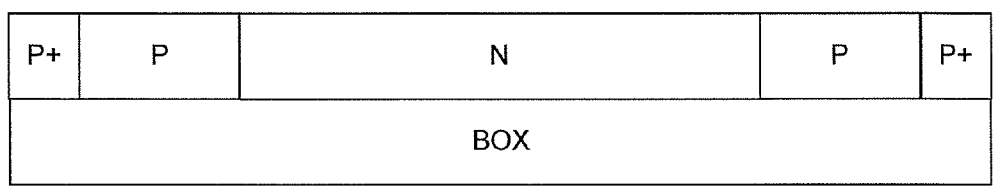

FIGS. 16A-16C shows another SCR embodiment 1600 where the transverse fins are broader or wider than the longitudinal fin. In other embodiments, the longitudinal fin could be broader or wider than the transverse fins. Also, cross-sections 16B-16C show an explicit example where the SCR device is disposed on a buried oxide layer (BOX) typically used in SOI technologies. Again, either SOI or bulk silicon substrates can be used in various embodiments.

Figure 17:
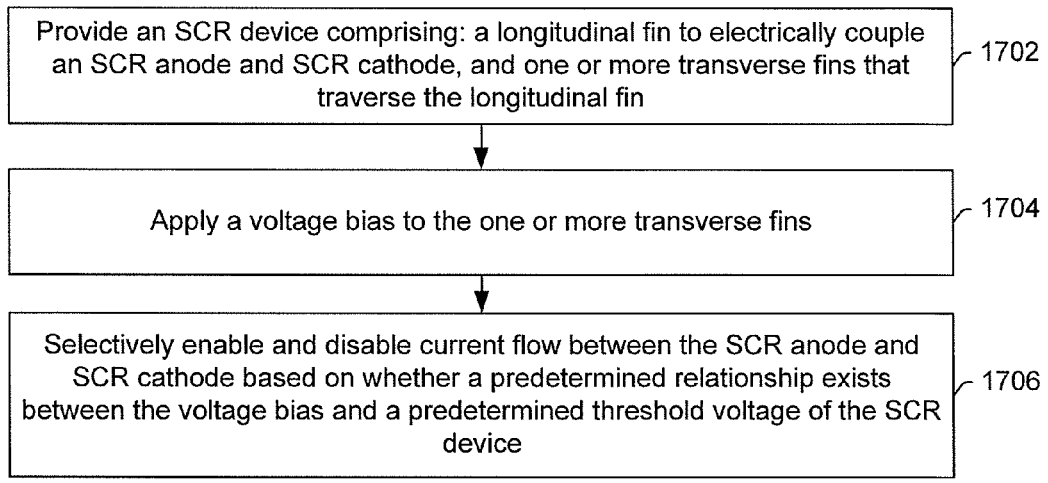
FIG. 17 shows a method in flowchart format in accordance with some embodiments.

FIG. 17 shows a method in accordance with some embodiments. The method starts at 1702 when an SCR device is provided. The SCR device comprises: a longitudinal fin to electrically couple an anode and cathode, and one or more transverse fins that traverse the longitudinal fin.

At 1704 a voltage is applied to the one or more transverse fins.

At 1706, current flow is enabled and disabled between the anode and cathode of the longitudinal fin based on whether a predetermined relationship exists between the voltage bias and a predetermined threshold voltage. For example, if the voltage bias applied is greater than the voltage threshold, current flow is enabled between anode and cathode; and if the voltage bias applied is less than the voltage threshold, current is disabled between anode and cathode. In some embodiments the voltage threshold can range from approximately 1V to approximately 8V, depending on the number of transverse fins and geometries of the respective fins, among other factors.

Figure 18:
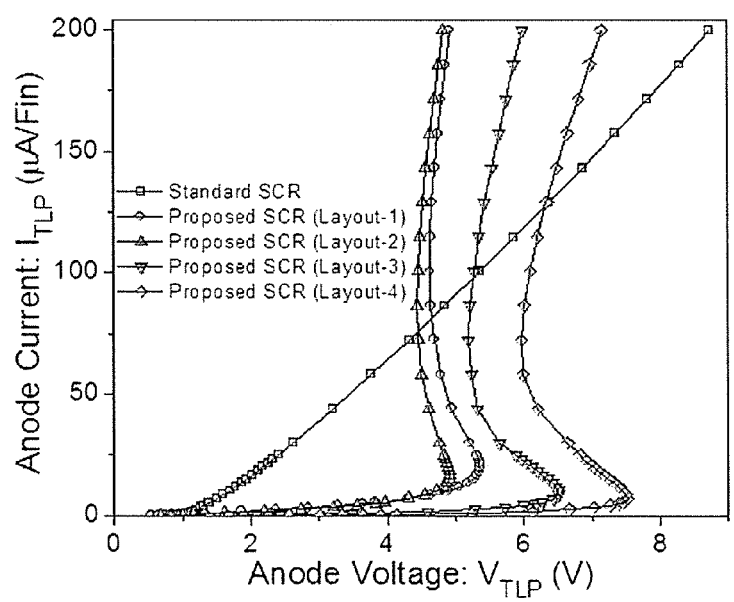
FIG. 18 shows I-V curves of ESD protection devices in accordance with some embodiments.

FIG. 18 shows several simulated current-voltage (I-V) curves for respective ESD protection circuits using respective SCR FinFET embodiments in accordance with this disclosure, compared to an ESD protection circuit using a conventional SCR device. To produce these curves, a transmission line pulse (TLP) has been applied to an ESD protection circuit, such as arranged in FIG. 1 for example, but which includes an SCR FinFET device rather than a conventional SCR device. The conventional device shows a relatively gradual turn-on and a relatively high on-resistance, as indicated by the slope of the IV curve. The SCR FinFET devices, in contrast, have a relatively sharp turn-on and a relatively low on-resistance.

Thus, it will be appreciated that some embodiments of the present disclosure relate to a silicon-controlled-rectifier (SCR) disposed on a substrate. The SCR includes a longitudinal silicon fin extending between an anode and a cathode and including a junction region there between. The SCR also includes one or more anode-side fins that traverse the longitudinal fin at one or more respective tapping points positioned between the anode and the junction region.

Other embodiments relate to a semiconductor device that includes a longitudinal fin comprised of silicon and a first transverse fin. The first longitudinal fin includes a first distal region having a first conductivity type; a first inner region contacting the first distal region at a first junction and having a second conductivity type; a second inner region contacting the first inner region at a second junction and having the first conductivity type; and a second distal region contacting the second inner region at a third junction and having the second conductivity type. The first transverse fin traverses the longitudinal fin at the first inner region. Still other embodiments relate to a method where an SCR device is provided. The (SCR) device includes a longitudinal fin to electrically couple an SCR anode and SCR cathode. The SCR also includes one or more first fins that traverse the longitudinal fin. A voltage bias is applied to the one or more transverse fins. Current flow is selectively enabled and disabled between the SCR anode and the SCR cathode based on whether a predetermined relationship exists between the voltage bias and a predetermined threshold voltage of the SCR device.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A silicon-controlled-rectifier (SCR) disposed on a substrate, comprising:
    a longitudinal silicon fin extending between a single anode and a single cathode and including a junction region there between;
    one or more first transverse fins that traverse the longitudinal fin at one or more respective tapping points positioned between the anode and the junction region; and
    one or more second transverse fins that traverse the longitudinal fin at one or more respective tapping points positioned between the junction region and the cathode;
    wherein at least one of the one or more first transverse fins and at least one of the one or more second transverse fins are spaced apart from one another along the longitudinal fin between the single anode and the single cathode and traverse the longitudinal fin by crossing the longitudinal fin and residing on both sides thereof.

2. The SCR of claim 1, wherein at least one of the one or more first transverse fins is in close proximity to the anode.

3. The SCR of claim 1, wherein at least one of the one or more second transverse fins is in close proximity to the cathode.

4. The SCR of claim 1, wherein the one or more first and second transverse fins are coupled together to form an electric field control tap of the SCR.

5. The SCR of claim 1, further comprising:
a gate dielectric adjacent to the junction region;
a conductive gate electrode adjacent to the gate dielectric and electrically isolated from the longitudinal fin via the gate dielectric, wherein the conductive gate electrode is spaced apart from the one or more first transverse fins; and
a voltage bias circuit to apply a voltage bias to the conductive gate electrode.

6. The SCR of claim 1, wherein the one or more first transverse fins have respective fin lengths that are larger near the anode region and the respective fin lengths decrease near the junction region.

7. The SCR of claim 1, wherein at least one of the one or more first transverse fins comprise respective metal fins which overlie the longitudinal fin at respective tapping points and which are in direct electrical contact with the longitudinal fin at the respective tapping points.

8. The SCR of claim 1, wherein at least one of the one or more first transverse fins are made of silicon and include respective distal end regions having respective doping concentrations that are higher than a doping concentration of the longitudinal fin between the junction region and the cathode.

9. The SCR of claim 1, wherein the substrate comprises a bulk silicon substrate.

10. The SCR of claim 1, wherein the substrate comprises a silicon-on-insulator (SOI) substrate.

11. The SCR of claim 1, wherein the longitudinal fin has a length between the anode and cathode that is less than a total distance between the anode and cathode, such that a single longitudinal fin does not extend continuously between the anode and cathode.

12. The SCR of claim 1, further comprising: at least one additional longitudinal fin in parallel with the longitudinal fin extending between the anode and cathode.

13. A semiconductor device, comprising:
a longitudinal fin comprised of silicon and including:
    a first distal region having a first conductivity type;
    a first inner region contacting the first distal region at a first junction and having a second conductivity type;
    a second inner region contacting the first inner region at a second junction and having the first conductivity type; and
    a second distal region contacting the second inner region at a third junction and having the second conductivity type; and
a first transverse fin that traverses the longitudinal fin at the first inner region;
wherein the first transverse fin extends outwardly in opposite directions from opposing sidewalls of the longitudinal fin.

14. The semiconductor device of claim 13, wherein:
the first distal region has a first doping concentration;
the first inner region has a second doping concentration;
the second inner region has a third doping concentration which is less than the first doping concentration; and
the second distal region has a fourth doping concentration which is greater than the second doping concentration.

15. The semiconductor device of claim 13, wherein the semiconductor device is structured to enable and disable current flow between the first and second distal regions based on whether a voltage bias applied to the first transverse fin has a predetermined relationship with a predetermined threshold voltage.

16. The semiconductor device of claim 13, wherein the first transverse fin is a metal body that overlies and is in direct electrical contact with the first inner region of the longitudinal fin.

17. The semiconductor device of claim 13, wherein the first transverse fin is a silicon body traversing the longitudinal fin.

18. The semiconductor device of claim 17, wherein the first transverse fin comprises:
a first transverse distal region extending away from a first sidewall of the longitudinal fin in a first direction, the first transverse distal region having the first conductivity type at a fifth doping concentration which is greater than the third doping concentration;
a first transverse inner region extending in the first direction and having the second conductivity type at a sixth doping concentration, wherein the sixth doping concentration is less than the fifth doping concentration;
a second transverse distal region extending away from a second sidewall of the longitudinal fin in a second direction, the second transverse distal region having the first conductivity type at a fifth doping concentration which is greater than the third doping concentration; and
a second transverse inner region extending in the second direction and having the second conductivity type at a sixth doping concentration, wherein the sixth doping concentration is less than the fifth doping concentration.

19. The semiconductor device of claim 13, further comprising:
a second transverse fin that traverses the longitudinal fin at the first inner region and spaced apart from the first transverse fin,
wherein the second transverse fin traverse the longitudinal fin by crossing the longitudinal fin and residing on both sides thereof, and
wherein the first distal region comprises a single anode and the second distal region comprises a single cathode.

20. The semiconductor device of claim 13, further comprising:
a third transverse fin that traverses the longitudinal fin at the second inner region.

21. The semiconductor device of claim 13, further comprising:
a gate dielectric adjacent to the second junction region;
a conductive gate electrode adjacent to the gate dielectric and electrically isolated from the longitudinal fin via the gate dielectric; and
a voltage bias circuit to apply a voltage bias to the conductive gate.

22. A semiconductor device, comprising:
a longitudinal fin comprised of silicon and including:
    a first distal region having a first conductivity type;
    a first inner region contacting the first distal region at a first junction and having a second conductivity type;
    a second inner region contacting the first inner region at a second junction and having the first conductivity type; and
    a second distal region contacting the second inner region at a third junction and having the second conductivity type; and
a first transverse fin that traverses the longitudinal fin at the first inner region;
wherein the first transverse fin is a silicon body traversing the longitudinal fin;
wherein the first transverse fin extends outwardly from only one sidewall of the longitudinal fin, the first transverse fin comprising:

a first transverse distal region having the first conductivity type at a fifth doping concentration; and a first transverse inner region having the second conductivity type at a sixth doping concentration.

23. The semiconductor device of claim 22:

wherein the fifth doping concentration is greater than the third doping concentration; and wherein the sixth doping concentration is less than the fifth doping concentration.

24. The semiconductor device of claim 22, wherein the first transverse fin further comprises:

a second transverse inner region having the first conductivity type at the second doping concentration, wherein the second transverse region is disposed between the first transverse inner region and the sidewall of the longitudinal fin.

25. A method comprising:

providing a silicon controlled rectifier (SCR) device comprising: a longitudinal fin extending between a single SCR anode and a single SCR cathode, and two or more transverse fins spaced apart from one another that traverse the longitudinal fin between the single SCR anode and the single SCR cathode, wherein at least two of the two or more transverse fins traverse the longitudinal fin by crossing the longitudinal fin and residing on both sides thereof;

applying a voltage bias to at least one of the two or more transverse fins; and selectively enabling and disabling current flow between the single SCR anode and the single SCR cathode based on whether a predetermined relationship exists between the voltage bias and a predetermined threshold voltage of the SCR device.

\* \* \* \* \*